United States Patent [19]

Grebe, Jr.

[11] 4,306,461

[45] Dec. 22, 1981

[54] METER INCORPORATING A DIGITAL FULLSCALE SETTING DEVICE

[75] Inventor: John C. Grebe, Jr., Norristown, Pa.

[73] Assignee: Emerson Electric Co., St. Louis, Mo.

[21] Appl. No.: 82,767

[22] Filed: Oct. 9, 1979

[51] Int. Cl.³ .............................................. G01F 1/60
[52] U.S. Cl. .............................. 73/861.12; 73/861.77; 235/92 FL
[58] Field of Search ........... 73/861.12, 861.16, 861.17, 73/3, 861.77, 861.78, 861.03; 328/38, 39, 41; 364/761-764; 235/92 FL

[56] References Cited

U.S. PATENT DOCUMENTS

| | | |
|---|---|---|
| 3,571,728 | 3/1971 | Andrea .................................... 328/41 |
| 3,818,354 | 6/1974 | Tomisawa et al. ..................... 328/41 |
| 3,873,814 | 3/1975 | Miradian ....................... 73/861.77 X |
| 3,895,529 | 7/1975 | Moore .............................. 73/861.03 |
| 3,950,989 | 4/1976 | Meirowitz ......................... 73/861.77 |
| 4,238,825 | 12/1980 | Geery ............................... 73/861.03 |

*Primary Examiner*—Charles A. Ruehl
*Attorney, Agent, or Firm*—Polster, Polster and Lucchesi

[57] ABSTRACT

A fullscale setting device for a magnetic flowmeter or the like receives a frequency encoded input and divides it by a mixed number having an integral part and a fractional part to produce an output. The mixed number may represent a flow rate which is taken as the fullscale setting, thereby making the fullscale setting independent of the calibration of the flowmeter.

6 Claims, 1 Drawing Figure

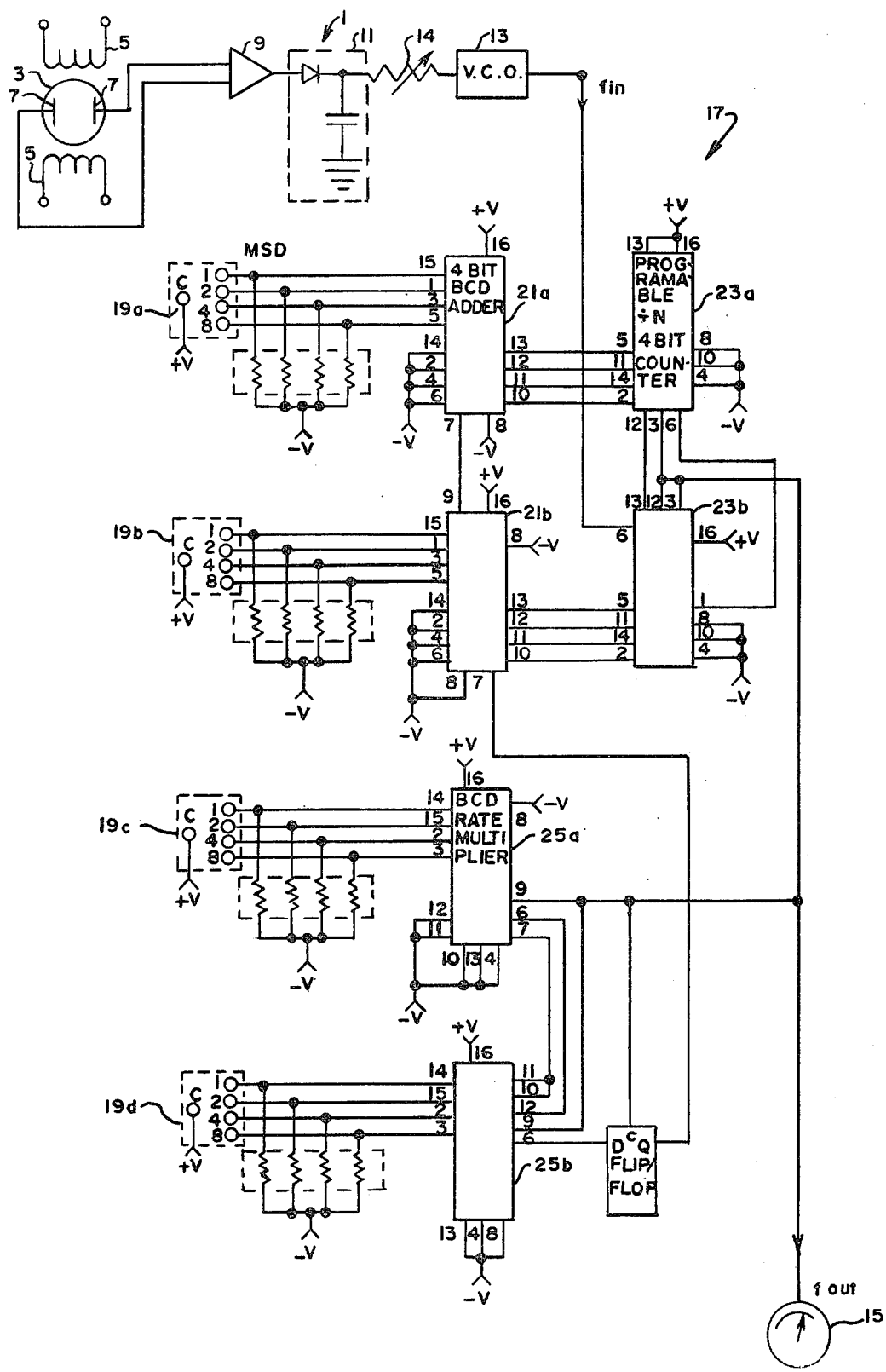

METER INCORPORATING A DIGITAL FULLSCALE SETTING DEVICE

BACKGROUND OF THE INVENTION

This invention relates to a scaling device for dividing an input frequency by a mixed number. It has particular utility as a fullscale setting device for a digital (frequency encoded) output of a flowmeter, such as a magnetic flowmeter.

Fluid flowmeters produce an output signal which is indicative of flow rate. In the case of a magnetic flowmeter, for example, the output signal may be proportional to flow velocity over a wide range of flow. For an incompressible fluid flowing in a filled pipe, the output signal is also proportional to the volume rate of flow over a wide range of flow rates. The output signal of a magnetic flowmeter is generally in the form of a DC (analog) signal, the magnitude (voltage) of which is proportional to flow rate. In the process of calibrating a flowmeter, it is usual to adjust a zero setting, then to adjust the calibration, then to adjust a "span" adjustment to set the output signal at its maximum for a maximum expected flow rate. Setting of the span adjustment is made more difficult because the adjustment is usually a potentiometer, and the fullscale setting for maximum flow rate must be set empirically in the field.

In certain magnetic flowmeters, the analog output signal is converted to a train of pulses, the frequency of which is indicative of flow rate. In these meters, the span adjustment is likewise a potentiometer in the analog portion of the signal processing chain. Additionally, a scaling device may be provided which divides the frequency output by a selectable integer to yield a desired output for a particular pipe size, for example, one pulse per gallon. The scaling device does not affect the full-scale frequency, which is typically 10 KHz, but rather divides the output frequency by an integer to provide a relatively low frequency signal. The scaling device inherently reduces the speed of response and the precision (resolution) of the meter.

SUMMARY OF THE INVENTION

One of the objects of this invention is to provide a fullscale setting device for a flowmeter or the like which may be set digitally, without affecting the calibration of the meter.

Another object is to provide such a device which can be set by entering a mixed number (whole number and fraction), representative of a maximum flow rate.

Another object is to provide a digital frequency divider, useful in such a fullscale setting device, which is capable of dividing by a mixed number.

Other objects will occur to those skilled in the art in light of the following description and accompanying drawing.

In accordance with one aspect of this invention, generally stated, a digital fullscale setting device is provided for a meter having an analog output, comprising means for converting the analog output to a frequency encoded output and frequency dividing means for dividing the frequency encoded output by a selectable number to provide a scaled output.

Although it is possible to divide the frequency encoded output by a whole number to produce the scaled output, the scaling factor must normally be a three or four digit number in order to provide suitable resolution and precision. To accommodate this large a scaling factor, the frequency of the encoded output must be at an unmanageably high rate, for presently available converters, to produce a useful output frequency. Likewise, devices are known which will multiply the scaled output by a selectable decimal fraction. These rate multipliers, however, operate by producing an output for each input for the preselected number of inputs N and produce no outputs for the remaining (10−N) inputs. The resulting pulse train is therefore not of uniform frequency and is difficult to process. Neither of these forms of rate division is therefore preferred for the fullscale setting device of the present invention. Rather, a novel scaling device is provided, capable of dividing by a mixed number in the form I.F where I is an integer and F is a decimal fraction of any length. The usefulness of the scaling device is not limited to flowmeters, and it may be used wherever it is desirable to divide a pulse train by a mixed number.

The scaling device of the present invention includes settable means for pre-setting a number N having an integer part I and a fractional part F, and means responsive to the settable means for alternatively producing either an output for each I inputs or an output for each (I+1) inputs through a cycle, the proportion of outputs for each (I+1) inputs in each cycle being equal to the fractional part F. Preferably, the fractional part F of the pre-settable means comprises at least one decimal fraction. In the preferred embodiment, the fractional part F of the pre-settable means comprises two decimal places (0.1 $F_t$ and 0.01 $F_h$), and the means responsive to the settable means thereby comprises means for producing an output for each (I+1) inputs (10 $F_t+F_h$) times for each cycle of 100 output pulses, the remaining 100−(10 $F_t+F_h$) output pulses being produced in response to I inputs. Preferably, the scaling device includes a programmable divide-by-N frequency divider and a programmable fractional rate multiplier, the fractional rate multiplier being responsive to the output of the frequency divider to cause the frequency divider to divide by I+1 a proportion of the time equal to the fractional number entered in the fractional rate multiplier.

BRIEF DESCRIPTION OF THE DRAWINGS

The FIGURE is a schematic drawing of a magnetic flowmeter embodying a fullscale setting device in accordance with the present invention.

DESCRIPTION OF THE PREFERRED EMBODIMENT

Referring now to the drawings, reference numeral 1 indicates a magnetic flowmeter system in which a preferred embodiment of the present invention is incorporated. The flowmeter system 1 includes a flowtube 3 through which an electrically conductive fluid is flowable. A pair of electromagnets 5 are positioned to produce across the flowtube 3 a periodic magnetic field, by means of a an electromagnet driver system, not shown. A pair of electrodes 7 are positioned in the flowtube 3 to pick up a voltage induced by the flow of the fluid through the magnetic field. A differential amplifier 9 is connected to the electrodes 7 to amplify the voltage signal produced across the electrodes 7. The amplitude of the periodic signal produced at the output of amplifier 9 is proportional to the flow rate of the fluid in the tube 3 in terms of velocity, and if the fluid fills the tube 3 and is incompressible, the amplitude of the signal is also proportional to volume rate of flow. All of these elements are known, and in themselves form no part of the present invention.

In the preferred flowmeter of this invention, the periodic signal produced at the output of the amplifier 9 is rectified to a DC signal by a rectifier 11. The rectified signal is then fed to a voltage controlled oscillator (VCO) 13, which produces a signal having a frequency proportional to the voltage applied to it, hence to the rate of flow of the fluid in the tube 3. It will be seen that the output of the VCO 13 may easily be calibrated to provide an output frequency which bears a desired relationship to flow rate, for example by providing a potentiometer 14 between the rectifier 11 and the VCO 13. In the preferred device, the output frequency of the VCO 13 is chosen to be about 300 KHz at a flowrate of 30 feed per second. If the tube 3 is a two inch pipe, this may correspond to a volumetric flow rate of 300 gallons per minute.

Between the output of the VCO 13 and a display device or other output instrument 15 is a fullscale setting device 17 of the present invention. The fullscale setting device consists of means for dividing the output frequency of the VCO 13 by a selectable number between 1.00 and 30.00. It will be seen that if the number chosen is 30.00, a flow rate of 30 ft./sec. or 300 gallons per minute in a two inch pipe will produce an output from the fullscale setting device 17 of 10 KHz. If the display device 15 is designed to regard 10 KHz as full scale, a flow rate of 300 gallons per minute will produce a full scale reading on the display device 15. If the selectable number is set at 17.34, then a frequency from the VCO 13 of 173.4 KHz (hence a flow rate of 17.34 ft./sec. or 173.4 gallons per minute) will produce an output of 10 KHz. Therefore, the device 17 permits any four digit number II.FF to be set as the fullscale setting without affecting the calibration of the meter.

The fullscale setting device 17 of the preferred embodiment includes four manually settable BCD switches 19a, 19b, 19c and 19d, each representing one digit of a fullscale setting number in the form II.FF, a pair of binary coded decimal adders 21a and 21b, a pair of programmable divide by N devices 23a and 23b, and a pair of rate multipliers 25a and 25b. By way of example, the BCD adders may be integrated circuits sold by Motorola Semiconductor Products Inc. as its MC14560 circuit, the programmable divide by N devices 23 may be its MC14522 circuit, and the rate multipliers 25 may be its MC14527 circuit.

The first switch 19a, representing the tens place $I_t$ of the settable number, is connected to one input set of the BCD adder 21a. The output of the BCD adder 21a is connected to the programmable divide by N device 23a, and determines the tens place of the divisor. The second switch 19b, representing the units place $I_u$ of the settable number, is connected to one input set of the BCD adder 21b. The units place of the other input is connected to the output of the rate multiplier 25a, as described hereinafter. The output of the BCD adder 21b is connected to the programmable divide by N device 23b, and determines the units place of the divisor. The programmable divide by N devices are cascaded in accordance with known techniques to divide by the two digit BCD number set by the BCD adders 21a and 21b.

The third switch 19c, representing the tenths place $F_t$, is connected to the rate multiplier 25a and determines the number of input counts to out of ten that produce an output pulse. The fourth switch 19d, representing the hundredths place $F_h$, is connected to the rate multiplier 25a and determines the number of input counts out of one hundred that produce an output pulse. The rate multipliers 25a and 25b are cascaded in accordance with known techniques to provide a number of output pulses for each one hundred input pulses in accordance with the two digit decimal number set by the switches 19c and 19d.

The input pulse train from the VCO 13 is fed to the clock input of the first programmable divide by N device 23a, which provides an output pulse after the number of input pulses set by the first two digits of the settable switches 19a and 19b. The output pulse is sent to the output device 17 as well as to the clock inputs of the rate multipliers 25a and 25b. If the switches 19c and 19d are set at anything but zero, the output pulse causes the multipliers 25a and 25c to produce output signals to the second BCD adder 21b for $F_tF_h$ out of the next one hundred signals. The signals from the rate multiplier are sent through a flip-flop 27 to the carry-in input of the "units" BCD adder 21b and cause the BCD adder to add one to the number set by the switches 19a and 19b. Therefore, for $F_tF_h$ output pulses out of a cycle of one hundred, the dividers 23a and 23b divide by a number $(I_tI_u+1)$ one greater than the number set by the switches representing the tens and units place of the fullscale setting. For the remainder of the first hundred output pulses from the dividers 23a and 23b, the rate multipliers 25a and 25b produce no output pulse, and the dividers 23a and 23b divide by the number $I_tI_u$ set by the switches 19a and 19b.

It will be seen that the number by which the input pulses to the fullscale device are divided is equal to one greater than the integral portion of the selectable number a proportion of the time equal to the fractional portion of the selectable manner. For example, if the number entered on the switches 19 is 17.34, the device will divide by "18" for thirty-four times, and by "17" for the remaining sixty-six times. The average resulting frequency will therefore be exactly the input frequency divided by 17.34. Thus, if the output of the VCO 13 is 173.4 KHz, the output of the device 17 is 10 KHz. It will also be seen that the output frequency is substantially constant for a given input frequency, and will respond instantanously to a change in input frequency. It will also be seen that the fullscale device, by permitting scaling by a mixed number, permits the VCO to operate at a frequency one-hundredth that which would be required to attain the same resolution using ordinary cascaded divide by N devices.

Numerous variations in the fullscale setting device of the present invention, within the scope of the appended claims, will occur to those skilled in the art in light of the foregoing disclosure. Merely by way of example, more divide by N devices or more rate multipliers may be cascaded to provide greater resolution, or fewer may be used if less resolution is required. Although the fullscale setting device has particular advantages and utility in a rate meter, such as a magnetic flowmeter, it may be used as a scaling device wherever divide by N devices or fractional rate multipliers are used. These variations are merely illustrative.

I claim:

1. In a meter producing an output in the form of a train of pulses having a frequency proportional to a quantity being measured, the improvement comprising a digital fullscale setting device for receiving said train of pulses as an input and producing a second train of pulses having a frequency equal to the frequency of said first train of pulses divided by a selectable number in the form of a mixed number having an integral part I and a fractional part F, said digital fullscale setting device comprising settable means for pre-setting a number N having an integer part I and a fractional part F, and means responsive to said settable means for alternatively producing either an output for each I inputs or an output for each (I+1) inputs through a cycle, the proportion of outputs for each (I+1) inputs in each cycle being equal to said fractional part F.

2. The improvement of claim 1 wherein the fractional part F of said pre-settable means comprises at least two decimal places 0.1 $F_t$ and 0.01 $F_h$ said means responsive to said settable means thereby comprising means for producing an output for each (I+1) inputs (10 $F_t$+$F_h$) times for each cycle of 100 output pulses, the remaining 100−(10 $F_t$+$F_h$) output pulses being produced in response to I inputs.

3. The improvement of claim 1 wherein said fullscale setting device includes a programmable divide by N frequency divider and a programmable fractional rate multiplier, said fractional rate multiplier being responsive to the output of said frequency divider to cause said frequency divider to divide by I+1 a proportion of the time equal to the fractional number entered in said fractional rate multiplier.

4. The improvement of claim 3 including an adder device, connected between an input to said frequency divider and a selectively programmable means, said rate multiplier being connected to said adder device.

5. The improvement of claim 1 wherein said selectable number is equal to a maximum rate to be measured.

6. The improvement of claim 1 wherein said meter is a magnetic flowmeter and said quantity being measured is a flow rate, and wherein the frequency of said first train of pulses is about 100 KHz—1000 KHz when said flow rate is about 30 feet per second.

* * * * *